US 10,924,071 B2

(12) United States Patent
Goto

(10) Patent No.: US 10,924,071 B2
(45) Date of Patent: Feb. 16, 2021

(54) SEMICONDUCTOR DEVICE

(71) Applicant: Murata Manufacturing Co., Ltd., Kyoto-fu (JP)

(72) Inventor: Satoshi Goto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 14 days.

(21) Appl. No.: 16/440,719

(22) Filed: Jun. 13, 2019

(65) Prior Publication Data

US 2020/0021255 A1    Jan. 16, 2020

(30) Foreign Application Priority Data

Jul. 12, 2018 (JP) ................... 2018-132650

(51) Int. Cl.
| | |
|---|---|
| *H03F 3/195* | (2006.01) |
| *H03F 3/213* | (2006.01) |
| *H01L 27/06* | (2006.01) |
| *H03F 3/21* | (2006.01) |
| *H01L 27/02* | (2006.01) |
| *H01L 29/737* | (2006.01) |
| *H01L 29/417* | (2006.01) |
| *H01L 23/00* | (2006.01) |

(52) U.S. Cl.
CPC .............. *H03F 3/213* (2013.01); *H01L 24/13* (2013.01); *H01L 27/0207* (2013.01); *H01L 27/0647* (2013.01); *H01L 29/41708* (2013.01); *H01L 29/737* (2013.01); *H03F 3/211* (2013.01); *H03F 2200/111* (2013.01); *H03F 2200/267* (2013.01); *H03F 2200/451* (2013.01)

(58) Field of Classification Search
CPC ........... H03F 3/187; H03F 3/195; H03F 3/213
USPC ......................................................... 330/307
See application file for complete search history.

(56) References Cited

U.S. PATENT DOCUMENTS

| 9,825,156 B2 | 11/2017 | Sasaki et al. |
| 2018/0218921 A1 | 8/2018 | Shimamoto |
| 2019/0312115 A1* | 10/2019 | Yamada ................. H03F 3/195 |

FOREIGN PATENT DOCUMENTS

JP    2017-112588 A    6/2017

* cited by examiner

*Primary Examiner* — Steven J Mottola
(74) *Attorney, Agent, or Firm* — Studebaker & Brackett PC

(57) ABSTRACT

A semiconductor device includes a semiconductor substrate including a principal surface parallel to a plane defined by a first direction and a second direction substantially orthogonal to the first direction, and the principal surface having a first side parallel to the first direction; first unit transistors, each amplifying a first signal in a first frequency band to output a second signal; and second unit transistors, each amplifying the second signal to output a third signal and aligned in the second direction between the first side and a substrate center line in the first direction in plan view of the principal surface. A first center line in the first direction of a region in which the first unit transistors are aligned is farther from the first side than a second center line in the first direction of a region in which the second unit transistors are aligned.

10 Claims, 13 Drawing Sheets

SEMICONDUCTOR DEVICE

CROSS-REFERENCE TO RELATED APPLICATION

This application claims benefit of priority to Japanese Patent Application No. 2018-132650, filed Jul. 12, 2018, the entire content of which is incorporated herein by reference.

BACKGROUND

Technical Field

The present disclosure relates to a semiconductor device.

Background Art

Mobile communication apparatuses, such as cellular phones, include a power amplifier circuit for amplifying the power of a radio frequency (RF) signal to be transmitted to a base station. The power amplifier circuit may employ, to achieve a high output power level, a structure in which a plurality of unit transistors connected in parallel to each other are arranged on a semiconductor substrate (hereinafter also referred to as a multi-finger structure).

In a multi-finger structure, variations in temperature may occur among unit transistors in accordance with the arrangement of the unit transistors. A transistor typically has temperature characteristics that the amount of current flow increases as the temperature increases. Thus, when variations in temperature occur among a plurality of unit transistors, current concentrates in a unit transistor with a high temperature, resulting in variations in current flow among the unit transistors. This makes the operations of the unit transistors uneven, causing issues such as insufficient output power, lower power efficiency, and thermal runaway and breakage of a unit transistor due to a large current flowing through the unit transistor with a high temperature.

To address these issues, for example, Japanese Unexamined Patent Application Publication No. 2017-112588 discloses a structure in which a diode included in a bias circuit is arranged near the center of a plurality of aligned unit transistors, thereby suppressing thermal runaway of the unit transistors.

The structure disclosed in Japanese Unexamined Patent Application Publication No. 2017-112588 includes amplifiers in two stages, that is, a first stage and a second stage, and both the amplifier in the first stage and the amplifier in the second stage may become a heat source. In this structure, however, an influence of heat generation by one of the amplifiers in the two stages on the other is not taken into consideration. Thus, depending on the layout of the amplifiers in the two stages, a maximum temperature of the plurality of unit transistors may increase or variations in temperature among the plurality of unit transistors may increase.

SUMMARY

Accordingly, the present disclosure to provide a semiconductor device that decreases a maximum temperature of a plurality of unit transistors or decreases variations in temperature among the plurality of unit transistors.

According to preferred embodiments of the present disclosure, a semiconductor device includes a semiconductor substrate including a principal surface that is parallel to a plane defined by a first direction and a second direction substantially orthogonal to the first direction; a plurality of first unit transistors each of which amplifies a first signal in a first frequency band to output a second signal; and a plurality of second unit transistors each of which amplifies the second signal to output a third signal. The principal surface includes a first side that is parallel to the first direction. On the semiconductor substrate, the plurality of second unit transistors are aligned in the second direction between the first side and a substrate center line in the first direction of the semiconductor substrate in plan view of the principal surface. The plurality of first unit transistors are aligned such that a first center line in the first direction of a region in which the plurality of first unit transistors are aligned is farther from the first side than a second center line in the first direction of a region in which the plurality of second unit transistors are aligned.

Also, according to preferred embodiments of the present disclosure, there is provided a semiconductor device that decreases a maximum temperature of a plurality of unit transistors or decreases variations in temperature among the plurality of unit transistors.

Other features, elements, characteristics and advantages of the present disclosure will become more apparent from the following detailed description of preferred embodiments of the present disclosure with reference to the attached drawings.

DETAILED DESCRIPTION

Figure 1:
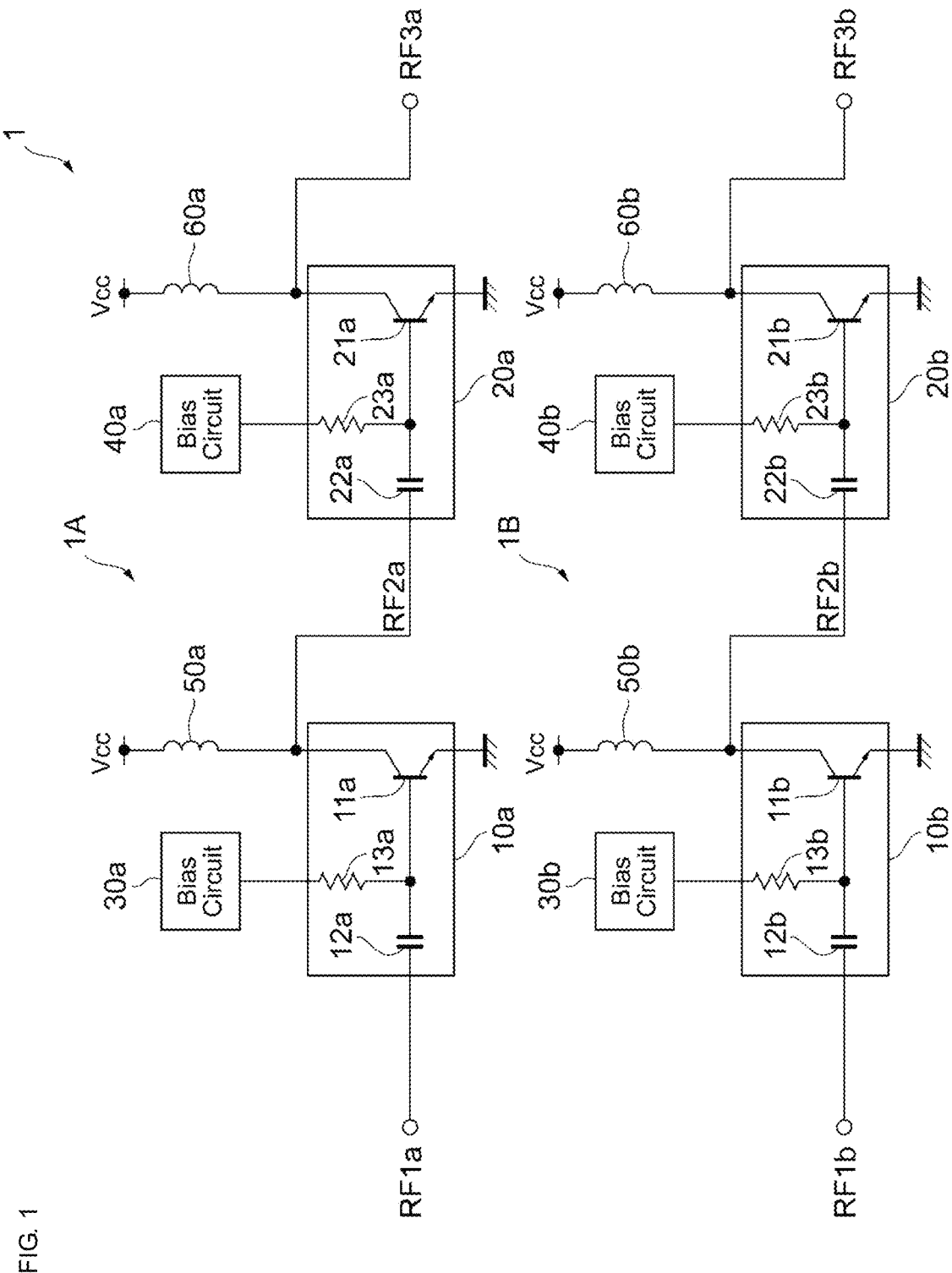
FIG. 1 is a circuit diagram of a power amplifier circuit included in a semiconductor device according to a first embodiment of the present disclosure.

Hereinafter, embodiments of the present disclosure will be described in detail with reference to the attached drawings. In the drawings, identical or similar elements are denoted by identical or similar reference numerals or symbols. The drawings are illustrative, in which the dimensions and shapes of individual parts are schematically illustrated. The technical scope of the present disclosure should not be interpreted as being limited to the embodiments.

FIG. 1 is a circuit diagram of a power amplifier circuit 1 included in a semiconductor device according to a first embodiment of the present disclosure. As illustrated in FIG. 1, the power amplifier circuit 1 is mounted in, for example, a mobile communication apparatus such as a cellular phone, and amplifies the power of a radio frequency (RF) signal to be transmitted to a base station. The frequency of an RF signal to be amplified is, for example, about several to tens of GHz.

The power amplifier circuit 1 includes two paths, that is, a path 1A and a path 1B. The paths 1A and 1B are selectively used in accordance with, for example, a difference in the communication standard or frequency band of the RF signal to be amplified. Here, it is assumed that the path 1A is supplied with an input signal RF1a in a first frequency band and that the path 1B is supplied with an input signal RF1b in a second frequency band.

The paths 1A and 1B include amplifiers 10a and 10b in a first stage (drive stage) and amplifiers 20a and 20b in a second stage (power stage), respectively, and amplify power in the two stages. Specifically, in the path 1A, the amplifier 10a in the first stage amplifies the input signal RF1a (first signal) in the first frequency band to output an amplified signal RF2a (second signal), and the amplifier 20a in the second stage amplifies the amplified signal RF2a to output an amplified signal RF3a (third signal). Likewise, in the path 1B, the amplifier 10b in the first stage amplifies the input signal RF1b (fourth signal) in the second frequency band to output an amplified signal RF2b (fifth signal), and the amplifier 20b in the second stage amplifies the amplified signal RF2b to output an amplified signal RF3b (sixth signal).

The path 1A includes, for example, the amplifiers 10a and 20a, bias circuits 30a and 40a, and inductors 50a and 60a. The amplifier 10a in the first stage includes a unit transistor 11a (first unit transistor), a capacitor 12a, and a resistance element 13a, and the amplifier 20a in the second stage includes a unit transistor 21a (second unit transistor), a capacitor 22a, and a resistance element 23a. Likewise, the path 1B includes the amplifiers 10b and 20b, bias circuits 30b and 40b, and inductors 50b and 60b. The amplifier 10b in the first stage includes a unit transistor 11b (third unit transistor), a capacitor 12b, and a resistance element 13b, and the amplifier 20b in the second stage includes a unit transistor 21b (fourth unit transistor), a capacitor 22b, and a resistance element 23b. Hereinafter, the structure of the path 1A will be described in detail as an example. The structure of the path 1B is similar to that of the path 1A, and thus similar reference numerals or symbols are assigned thereto and the description thereof is omitted.

The unit transistors 11a and 21a are, for example, bipolar transistors such as heterojunction bipolar transistors (HBTs). Here, a "unit transistor" is a minimum unit structure that includes at least a base layer, a collector layer, and an emitter layer and that functions as a transistor.

The unit transistor 11a includes a collector that is supplied with a power supply voltage Vcc through the inductor 50a, a base that is supplied with the input signal RF1a through the capacitor 12a, and an emitter that is grounded. The base of the unit transistor 11a is also supplied with a bias current or bias voltage from the bias circuit 30a through the resistance element 13a. Accordingly, the collector of the unit transistor 11a outputs the amplified signal RF2a, which is generated by amplifying the power of the input signal RF1a. Likewise, the unit transistor 21a includes a collector that is supplied with the power supply voltage Vcc through the inductor 60a, a base that is supplied with the amplified signal RF2a through the capacitor 22a, and an emitter that is grounded. The base of the unit transistor 21a is also supplied with a bias current or bias voltage from the bias circuit 40a through the resistance element 23a. Accordingly, the collector of the unit transistor 21a outputs the amplified signal RF3a, which is generated by amplifying the power of the amplified signal RF2a.

Alternatively, field-effect transistors (metal-oxide-semiconductor field-effect transistors (MOSFETs)) may be used instead of HBTs as the unit transistors 11a and 21a. In this case, the collector, the base, and the emitter are replaced with the drain, the gate, and the source, respectively.

The capacitors 12a and 22a block direct-current (DC) components of the input signal RF1a and the amplified signal RF2a, respectively, and allow alternating-current (AC) components to pass therethrough. The resistance elements 13a and 23a are connected between output terminals of the bias circuits 30a and 40a and the bases of the unit transistors 11a and 21a, respectively. The capacitors 12a and 22a and the resistance elements 13a and 23a are connected, as additional elements, to the bases of the unit transistors 11a and 21a, respectively. Each of the unit transistors 11a and 21a constitutes, together with these additional elements, one unit cell.

Figure 2:
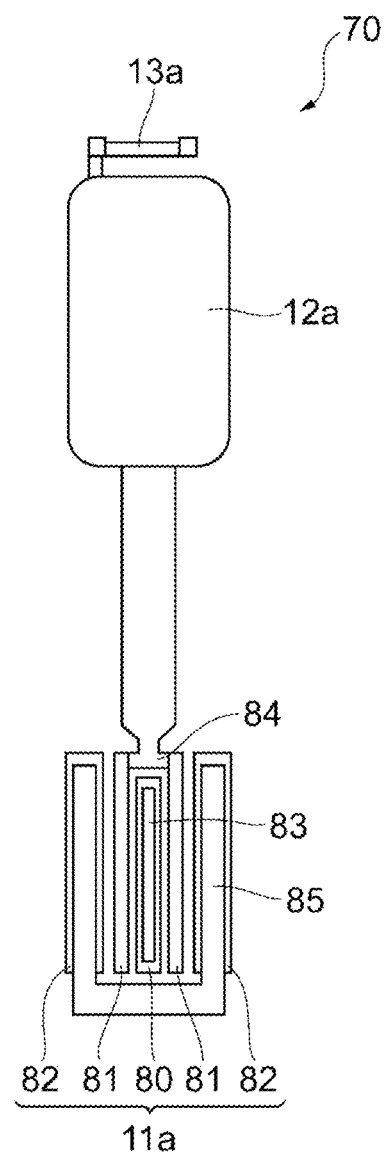
FIG. 2 is a plan view illustrating the structure of one unit cell included in an amplifier.

FIG. 2 is a plan view illustrating the structure of one unit cell 70 included in an amplifier. The amplifier 10a in the first stage and the amplifier 20a in the second stage have structures similar to each other. For convenience of description, the amplifier 10a in the first stage will be described as an example with reference to FIG. 2.

As illustrated in FIG. 2, the unit cell 70 includes the unit transistor 11a, the capacitor 12a, and the resistance element 13a that are aligned in plan view of a principal surface of a semiconductor substrate which will be described below. In the unit transistor 11a in its plan view, a base layer 81 is arranged on both outer sides of a substantially rectangular emitter layer 80, and a collector layer 82 is arranged on both outer sides of the base layer 81. An emitter electrode 83, a base electrode 84, and a collector electrode 85 are disposed on the emitter layer 80, the base layer 81, and the collector layer 82, respectively. The capacitor 12a is arranged next to the extended portion of the base electrode 84, and the resistance element 13a is arranged next to the capacitor 12a.

Although each element included in each of the amplifiers 10a and 20a is illustrated by one circuit symbol in FIG. 1, each of the amplifiers 10a and 20a according to the present embodiment includes a plurality of unit cells. Among the plurality of unit cells, the collectors, the emitters, and the bases of the unit transistors are respectively and electrically connected to each other. Accordingly, the plurality of unit cells are connected in parallel to each other and operate as one amplifier as a whole.

Referring back to FIG. 1, the bias circuits 30a and 40a generate bias currents or bias voltages and supply the bias currents or bias voltages to the bases of the unit transistors 11a and 21a through the resistance elements 13a and 23a, respectively. The inductors 50a and 60a prevent leakage of RF signals from the collectors of the unit transistors 11a and 21a, respectively, to a power supply circuit (not illustrated).

Although not illustrated in FIG. 1, the power amplifier circuit 1 may include matching circuits for achieving impedance matching before or after the amplifiers 10a, 20a, 10b, and 20b.

Next, a description will be given of a layout in the power amplifier circuit 1 disposed on a semiconductor substrate, with reference to FIG. 3.

Figure 3:
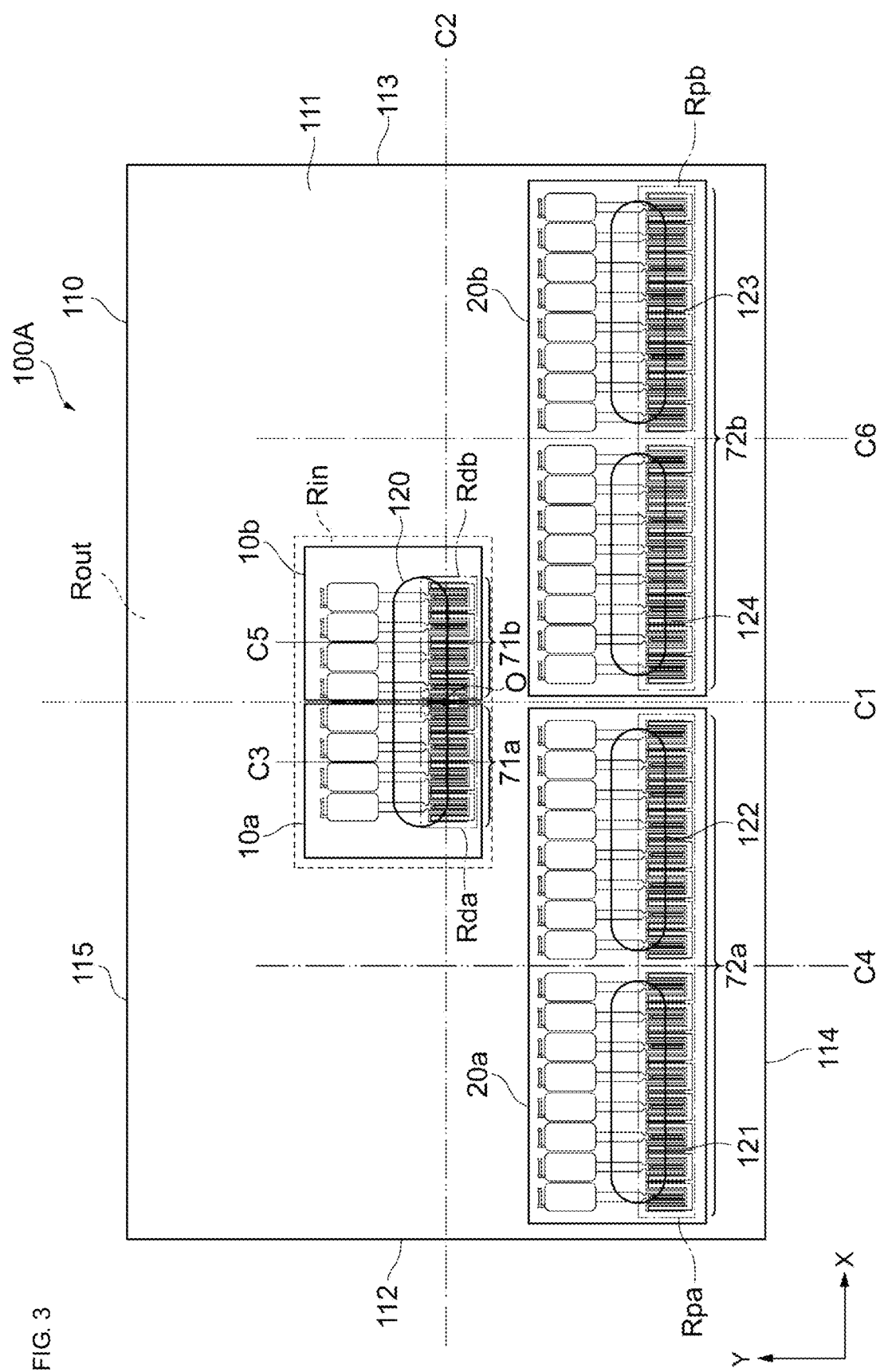
FIG. 3 is a plan view of the semiconductor device according to the first embodiment of the present disclosure.

FIG. 3 is a plan view of a semiconductor device 100A according to the first embodiment of the present disclosure. FIG. 3 illustrates the amplifiers 10a, 20a, 10b, and 20b, which may become a heat source in an operating state, among the elements included in the above-described power amplifier circuit 1. The illustration of other elements is omitted therein.

As illustrated in FIG. 3, the semiconductor device 100A includes, for example, a semiconductor substrate 110; the amplifiers 10a, 20a, 10b, and 20b disposed on the semiconductor substrate 110; and bumps 120 to 124 disposed on the amplifiers 10a, 20a, 10b, and 20b.

The semiconductor substrate 110 includes a principal surface 111 that is parallel to an XY plane defined by an X axis (second direction) and a Y axis (first direction) substantially orthogonal to the X axis. The principal surface 111 has a substantially rectangular shape including a side 112 (first side) and a side 113 (second side) that are opposed to each other and extend along the Y axis, and a side 114 and a side 115 that are opposed to each other and extend along the X axis. Hereafter, the sides 112 to 115 are also collectively referred to as an "outer frame". An intersection point of a center line C1 (substrate center line) along the Y axis of the semiconductor substrate 110 and a center line C2 along the X axis of the semiconductor substrate 110 is referred as a center O.

In plan view of the principal surface 111 of the semiconductor substrate 110, the amplifiers 10a and 20a included in the path 1A are disposed between the center line C1 and the side 112, and the amplifiers 10b and 20b included in the path 1B are disposed between the center line C1 and the side 113. These two paths 1A and 1B may operate simultaneously. Alternatively, while one of the paths 1A and 1B is performing an amplification operation, the other may perform no amplification operation.

In the present embodiment, the amplifiers 10a and 10b in the first stage include four unit cells 71a and four unit cells 71b, respectively, and the amplifiers 20a and 20b in the second stage include sixteen unit cells 72a and sixteen unit cells 72b, respectively. The number of unit cells included in each amplifier is an example and is not limited thereto. Typically, the amplifier in the second stage outputs larger power than the amplifier in the first stage, and thus the amplifier in the second stage includes a larger number of unit cells than the amplifier in the first stage.

The four unit cells 71a and the four unit cells 71b in the first stage are aligned in a substantially rectangular center region Rin including the center O of the principal surface 111 in plan view of the principal surface 111 of the semiconductor substrate 110. On the other hand, the sixteen unit cells 72a and the sixteen unit cells 72b in the second stage are aligned in a substantially rectangular loop shaped peripheral region Rout surrounding the center region Rin in plan view of the principal surface 111 of the semiconductor substrate 110. As illustrated in FIG. 3, the unit cells 71a and 72a of the path 1A and the unit cells 71b and 72b of the path 1B are arranged symmetrically about the center line C1 of the semiconductor substrate 110.

More specifically, the four unit cells 71a of the path 1A are aligned in one line in the X-axis direction between the center line C1 and the side 112 in the center region Rin. The sixteen unit cells 72a of the path 1A are aligned in one line in the X-axis direction between the center line C1 and the side 112 in the peripheral region Rout. Here, the center line along the Y axis of a region Rda in which individual unit transistors included in the unit cells 71a are aligned (in FIG. 3, a boundary line that splits the four unit cells 71a into two groups each including two unit cells) is referred to as a center line C3 (first center line), and the center line along the Y axis of a region Rpa in which individual unit transistors included in the unit cells 72a are aligned (in FIG. 3, a boundary line that splits the sixteen unit cells 72a into two groups each including eight unit cells) is referred to as a center line C4 (second center line). In the present embodiment, the center line C3 is farther than the center line C4 from the side 112.

Likewise, the four unit cells 71b of the path 1B are aligned in one line in the X-axis direction between the center line C1 and the side 113 in the center region Rin. The sixteen unit cells 72b of the path 1B are aligned in one line in the X-axis direction between the center line C1 and the side 113 in the peripheral region Rout. Here, the center line along the Y axis of a region Rdb in which individual unit transistors included in the unit cells 71b are aligned (in FIG. 3, a boundary line that splits the four unit cells 71b into two groups each including two unit cells) is referred to as a center line C5 (third center line), and the center line along the Y axis of a region Rpb in which individual unit transistors included in the unit cells 72b are aligned (in FIG. 3, a boundary line that splits the sixteen unit cells 72b into two groups each including eight unit cells) is referred to as a center line C6 (fourth center line). In the present embodiment, the center line C5 is farther than the center line C6 from the side 113.

In the center region Rin, the four unit cells 71a of the path 1A and the four unit cells 71b of the path 1B are aligned adjacent to each other in the X-axis direction. The effects and advantages obtained by arranging the amplifiers 10a and 10b in the first stage and the amplifiers 20a and 20b in the second stage in this manner will be described below.

The plurality of bumps 120 to 124 are arranged in accordance with the alignment of the plurality of unit cells. In the present embodiment, the unit transistors are aligned in the X-axis direction, and thus each of the bumps 120 to 124 has a substantially elongated oval shape extending in the X-axis direction. In FIG. 3, the bumps are illustrated in a see-through manner so that the positional relationship between the unit cells and the bumps can be seen. In the present embodiment, the unit cells are disposed on the principal surface 111 of the semiconductor substrate 110, and the bumps are disposed on the unit cells.

Specifically, the bump 120 is arranged in the center region Rin such that at least a part of the bump 120 overlaps the individual unit transistors included in the four unit cells 71a and the individual unit transistors included in the four unit cells 71b. The bump 120 is electrically connected to the emitter layers of the eight unit transistors in total and functions as an emitter electrode. That is, the bump 120 is shared between the amplifier 10a of the path 1A and the amplifier 10b of the path 1B.

The bump 121 is arranged such that at least a part of the bump 121 overlaps the individual unit transistors included in the eight unit cells between the center line C4 and the side 112 among the sixteen unit cells 72a. The bump 122 is arranged such that at least a part of the bump 122 overlaps the individual unit transistors included in the eight unit cells between the center line C4 and the center line C1 among the sixteen unit cells 72a. Each of the bumps 121 and 122 is electrically connected to the emitter layers of the corresponding eight unit transistors and functions as an emitter electrode.

Likewise, the bump 123 is arranged such that at least a part of the bump 123 overlaps the individual unit transistors included in the eight unit cells between the center line C6 and the side 113 among the sixteen unit cells 72b. The bump 124 is arranged such that at least a part of the bump 124 overlaps the individual unit transistors included in the eight unit cells between the center line C6 and the center line C1 among the sixteen unit cells 72b. Each of the bumps 123 and 124 is electrically connected to the emitter layers of the corresponding eight unit transistors and functions as an emitter electrode.

The semiconductor device 100A has a so-called flip-chip structure. When the semiconductor substrate 110 is mounted on a module substrate, the bumps 120 to 124 are electrically connected to a ground electrode of the module substrate. Accordingly, the emitters of the individual unit transistors are grounded. The material of the bumps 120 to 124 is not particularly limited, but Cu pillar bumps may be used, for example.

Next, a description will be given of the effects and advantages of the arrangement of the amplifiers 10a, 10b, 20a, and 20b, by using the path 1A as an example. Each of the unit cells 71a and 72a may become a heat source in an operating state. The unit cells 71a and the unit cells 72a may simultaneously operate, and thus the heat generated by the unit cells 71a in the first stage has an influence on the temperatures of the unit cells 72a in the second stage. In the semiconductor substrate 110, the peripheral region Rout is closer to the outer frame and has a more limited heat radiation region than the center region Rin. Thus, the temperature is more likely to increase in the peripheral region Rout than in the center region Rin. Therefore, in the amplifier 20a in the second stage of the path 1A, for example, the temperature is more likely to increase in a unit cell close to the outer frame than in a unit cell far from the outer frame among the sixteen unit cells 72a. As described above, in the semiconductor device 100A, the sixteen unit cells 72a are aligned in one line in the X-axis direction. Thus, the distances from the sixteen unit cells 72a to the sides 114 and 115 are uniform, but the distances from the sixteen unit cells 72a to the side 112 vary. For this reason, the temperature is higher in a unit cell close to the side 112 than in a unit cell far from the side 112.

In the semiconductor device 100A, the center line C3 of the region Rda in which the four unit transistors in the first stage are disposed is farther from the side 112 than the center line C4 of the region Rpa in which the sixteen unit transistors in the second stage are disposed, as described above. This makes it possible to suppress an increase in temperature of a unit cell close to the side 112 in the amplifier 20a in the second stage, compared with a structure in which the center line C3 of the amplifier 10a in the first stage is near the center line C4 or between the center line C4 and the side 112. Thus, the maximum temperature of the unit cells 72a included in the amplifier 20a in the second stage can be decreased and variations in temperature among the unit cells 72a can be decreased. Also in the path 1B, the center line C5 of the region Rdb in which the four unit transistors in the first stage are disposed is farther from the side 113 than the center line C6 of the region Rpb in which the sixteen unit transistors in the second stage are disposed. This makes it possible to suppress an increase in temperature of a unit cell close to the side 113.

As described above, according to the present embodiment, variations in temperature among unit transistors included in an amplifier can be suppressed, which makes it possible to prevent insufficient output power, lower power efficiency, and breakage of a transistor resulting from thermal runaway.

In the present embodiment, the bump 120 connected to the emitter layers of the unit transistors included in the amplifiers 10a and 20a in the first stage is shared between the path 1A and the path 1B. Accordingly, the area of the bump can be increased compared with a structure in which a bump is provided for each path. Furthermore, the area of the ground electrode of the module substrate connected to the bump 120 can also be increased. Thus, compared with a structure in which a bump is provided for each path, the resistance components and inductance components of the emitters are reduced and a decrease in gain of the amplifiers 10a and 10b can be suppressed.

In the present embodiment, the bumps 120 to 124 are not directly above the individual unit transistors but are arranged so as to be deviated from the unit transistors in the Y-axis direction, as illustrated in FIG. 3. This arrangement reduces the stress applied to the individual unit transistors through the bumps 120 to 124 when mounting the semiconductor substrate 110 on the module substrate, and failure of the unit transistors can be prevented. Note that there is no intention of eliminating from the present disclosure the structure in which a bump is disposed directly above unit transistors.

In the present embodiment, the unit cells 71a are aligned in one line, and the same applies to the unit cells 71b, the unit cells 72a, and the unit cells 72b. These unit cells need not necessarily be aligned in one line, and may be aligned in two or more lines.

In the present embodiment, the two paths 1A and 1B are disposed on the semiconductor substrate 110. Alternatively, either the path 1A or the path 1B may be disposed thereon. In that case, an element different from an amplifier may be disposed in a region where no path is disposed.

In the present embodiment, each of the paths 1A and 1B includes amplifiers in two stages. The number of stages is not limited to two, and three or more stages may be provided. In that case, the above-described "first stage" may be a second or higher order stage, and the above-described "second stage" may be any stage higher than the stage corresponding to the "first stage".

Figure 4A:
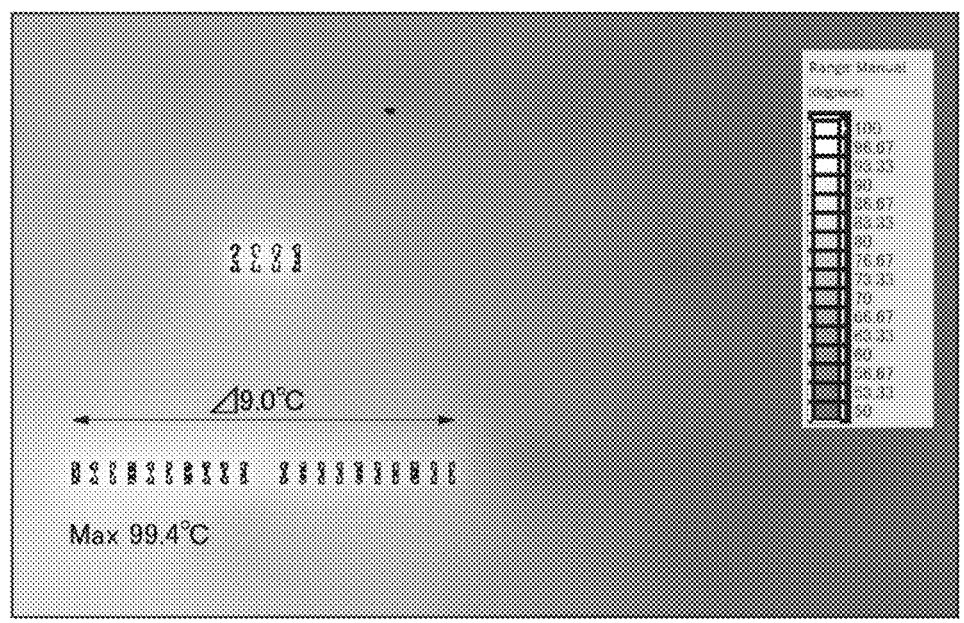
FIG. 4A illustrates a simulation result showing a temperature distribution in a semiconductor device according to a comparative example.
Figure 4B:
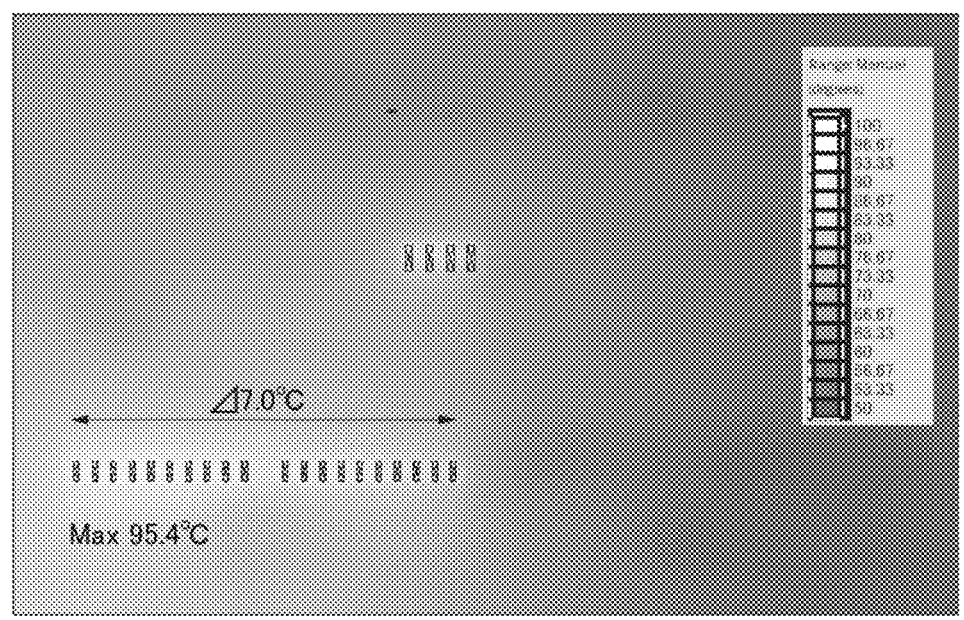
FIG. 4B illustrates a simulation result showing a temperature distribution in the semiconductor device according to the first embodiment of the present disclosure.

FIG. 4A illustrates a simulation result showing a temperature distribution in a semiconductor device according to a comparative example, and FIG. 4B illustrates a simulation result showing a temperature distribution in the semiconductor device 100A according to the first embodiment of the present disclosure. The semiconductor device according to the comparative example has a structure in which an amplifier in the first stage is disposed near the center line of an amplifier in the second stage, unlike the above-described semiconductor device 100A, as illustrated in FIG. 4A. These simulation results are obtained in a case where the path 1A performs an amplification operation whereas the path 1B does not perform an amplification operation. That is, the region in which the path 1B is disposed has no influence on the region in which the path 1A is disposed in terms of heat generation. In addition, these simulation results are obtained in a case where the power consumed by the amplifier in the first stage is 0.3 W and the power consumed by the amplifier in the second stage is 1.0 W. These conditions are also applied to the simulations illustrated in FIGS. 9 and 11 which will be described below.

It is understood from FIGS. 4A and 4B that, in both the semiconductor device according to the comparative example and the semiconductor device 100A according to the present embodiment, temperature is higher in a unit transistor close to the outer frame of the semiconductor substrate than in a unit transistor far from the outer frame in the amplifier in the second stage. However, the temperatures of the eight unit transistors especially close to the outer frame are lower in the semiconductor device 100A than in the semiconductor device according to the comparative example. Specifically, in the comparative example, the maximum temperature of the plurality of unit transistors in the second stage is 99.4 degrees, and the difference between the maximum temperature and the minimum temperature is 9.0 degrees. On the other hand, in the semiconductor device 100A, the maximum temperature of the plurality of unit transistors in the second stage is 95.4 degrees, and the difference between the maximum temperature and the minimum temperature is 7.0 degrees. That is, in the semiconductor device 100A, the maximum temperature of the unit transistors is decreased and variations in temperature among the unit transistors are suppressed compared with the semiconductor device according to the comparative example.

Figure 5:
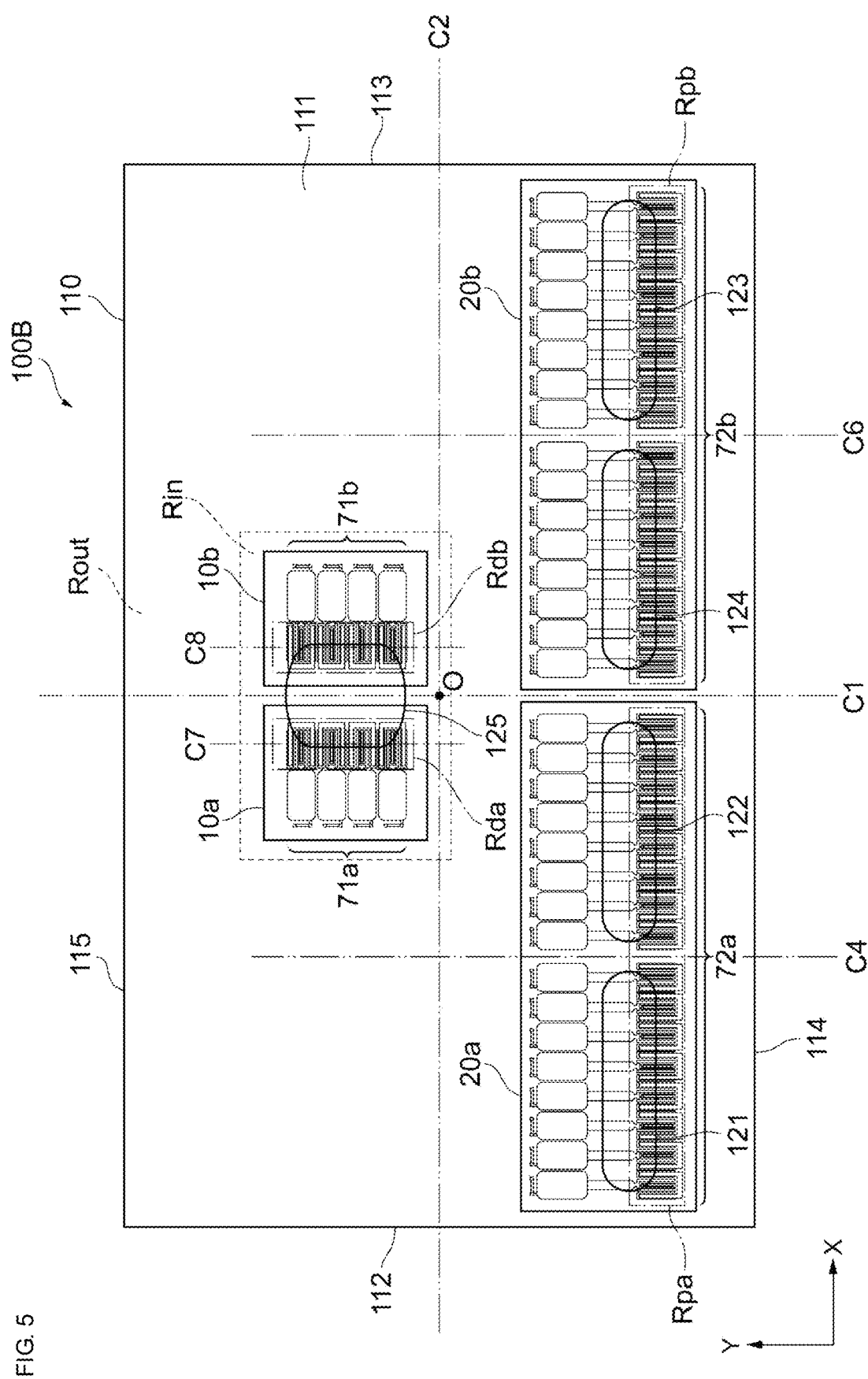
FIG. 5 is a plan view of a semiconductor device according to a second embodiment of the present disclosure.

FIG. 5 is a plan view of a semiconductor device 100B according to a second embodiment of the present disclosure. Hereinafter, the description of the same points as those in the first embodiment will be omitted, and only the difference will be described. In particular, similar effects and advantages obtained from similar structures will not be described in each embodiment. For convenience of description, individual unit cells are denoted by reference numerals or symbols similar to those in FIG. 3 even if the arrangement or detailed structure thereof is different from that in the other embodiments.

As illustrated in FIG. 5, the semiconductor device 100B is different from the semiconductor device 100A illustrated in FIG. 3 in the orientations of the unit cells in the first stage of the paths 1A and 1B and in the shape of a bump. Specifically, the semiconductor device 100B includes a bump 125 instead of the bump 120.

In the present embodiment, in the amplifier 10a in the first stage of the path 1A and the amplifier 10b in the first stage of the path 1B, the four unit cells 71a and the four unit cells 71b are aligned in the Y-axis direction. The center line along the Y axis of the region Rda in which individual unit transistors included in the unit cells 71a are aligned (in FIG. 5, a line crossing the four unit transistors) is referred to as a center line C7 (first center line), and the center line along the Y axis of the region Rdb in which individual unit transistors included in the unit cells 71b are aligned (in FIG. 5, a line crossing the four unit transistors) is referred to as a center line C8. The bump 125 is arranged on the unit cells 71a the unit cells 71b such that at least a part of the bump 125 overlaps the individual unit transistors included in the unit cells of both the path 1A and the path 1B, like the bump 120.

In the semiconductor device 100B with this structure, the center line C7 of the region Rda in which the four unit transistors in the first stage are disposed is farther from the side 112 than the center line C4 of the region Rpa in which the sixteen unit transistors in the second stage are disposed. Also in the path 1B, the center line C8 of the region Rdb in which the four unit transistors in the first stage are disposed is farther from the side 113 than the center line C6 of the region Rpb in which the sixteen unit transistors in the second stage are disposed. Thus, advantages similar to those in the semiconductor device 100A can be obtained. As in the unit cells 71a and 71b illustrated in FIG. 5, the unit transistor and the capacitor may be adjacent to each other in each unit cell.

Figure 6:
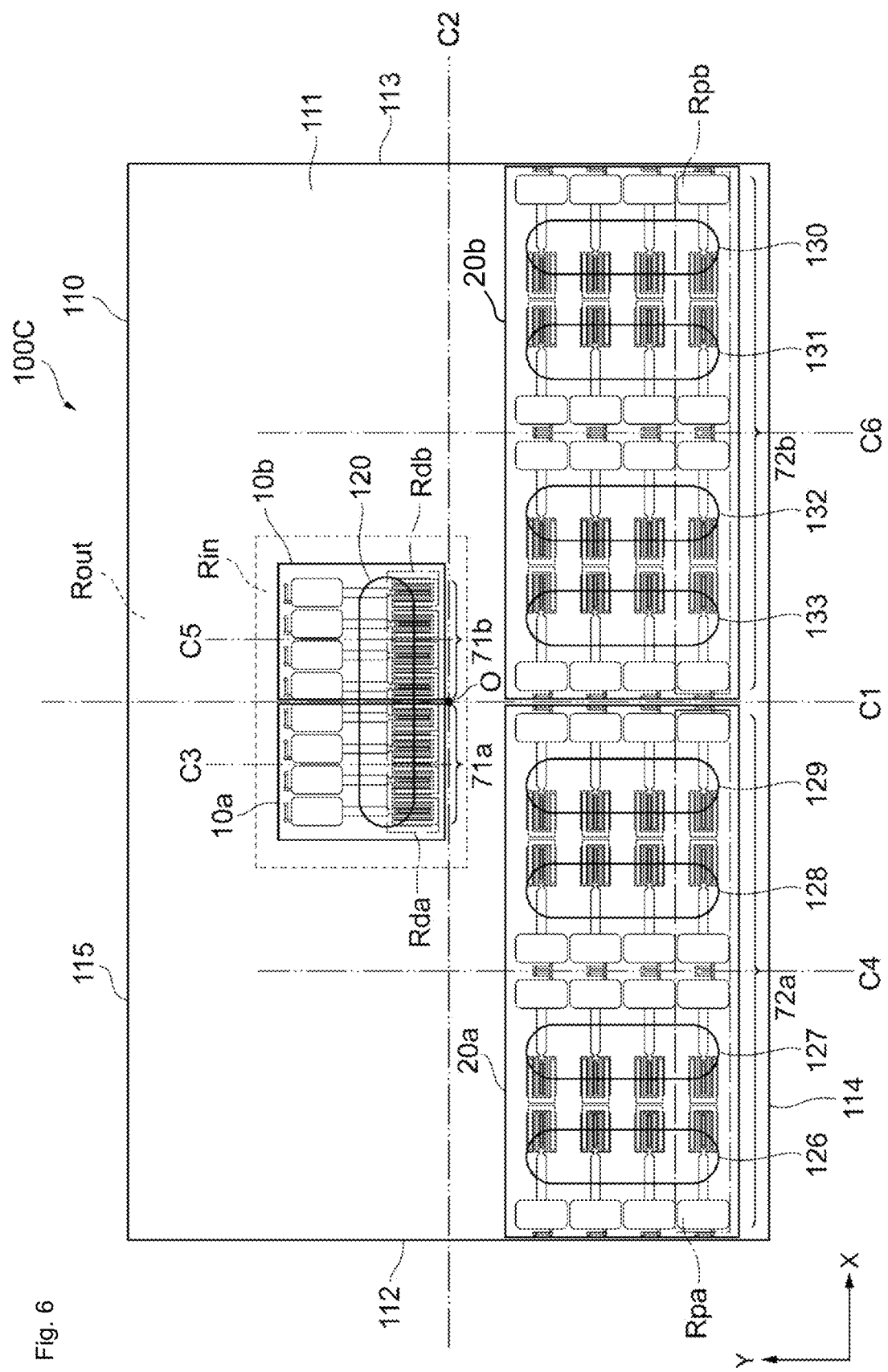
FIG. 6 is a plan view of a semiconductor device according to a third embodiment of the present disclosure.

FIG. 6 is a plan view of a semiconductor device 100C according to a third embodiment of the present disclosure. As illustrated in FIG. 6, the semiconductor device 100C is different from the semiconductor device 100A illustrated in FIG. 3 in the orientations of the unit cells of the amplifiers 20a and 20b in the second stage of each of the paths 1A and 1B and in the shapes and the number of bumps. Specifically, the semiconductor device 100C includes bumps 126 to 133 instead of the bumps 121 to 124.

In the present embodiment, in the amplifier 20a in the second stage of the path 1A, the sixteen unit cells 72a are aligned in units of four unit cells in the X-axis direction. The four unit cells aligned in the X-axis direction are regarded as one line, and four lines are aligned in the Y-axis direction. In the present embodiment, the center line C4 along the Y axis of the region Rpa is a boundary line that splits the four unit cells 72a into two groups each including two unit cells, and the center line C6 along the Y axis of the region Rpb is a boundary line that splits the four unit cells 72b into two groups each including two unit cells. Each of the bumps 126 to 129 is arranged so as to extend over the four unit cells aligned in the Y-axis direction. Also in the path 1B, in the amplifier 20b in the second stage, the sixteen unit cells 72b are aligned in units of four unit cells in the X-axis direction. The four unit cells aligned in the X-axis direction are regarded as one line, and four lines are aligned in the Y-axis direction. Each of the bumps 130 to 133 is arranged so as to extend over the four unit cells aligned in the Y-axis direction.

In the semiconductor device 100C with this structure, the center line C3 of the region Rda in which the four unit transistors in the first stage are disposed is farther from the side 112 than the center line C4 of the region Rpa in which the four unit transistors in the second stage are disposed. Also in the path 1B, the center line C5 of the region Rdb in which the four unit transistors in the first stage are disposed is farther from the side 113 than the center line C6 of the region Rpb in which the four unit transistors in the second stage are disposed. Thus, advantages similar to those in the semiconductor device 100A can be obtained. Like the unit cells 72a and 72b illustrated in FIG. 6, the unit cells need not necessarily be aligned in the same orientation, and may be aligned such that the positions of the unit transistors and the capacitors alternate.

Figure 7:
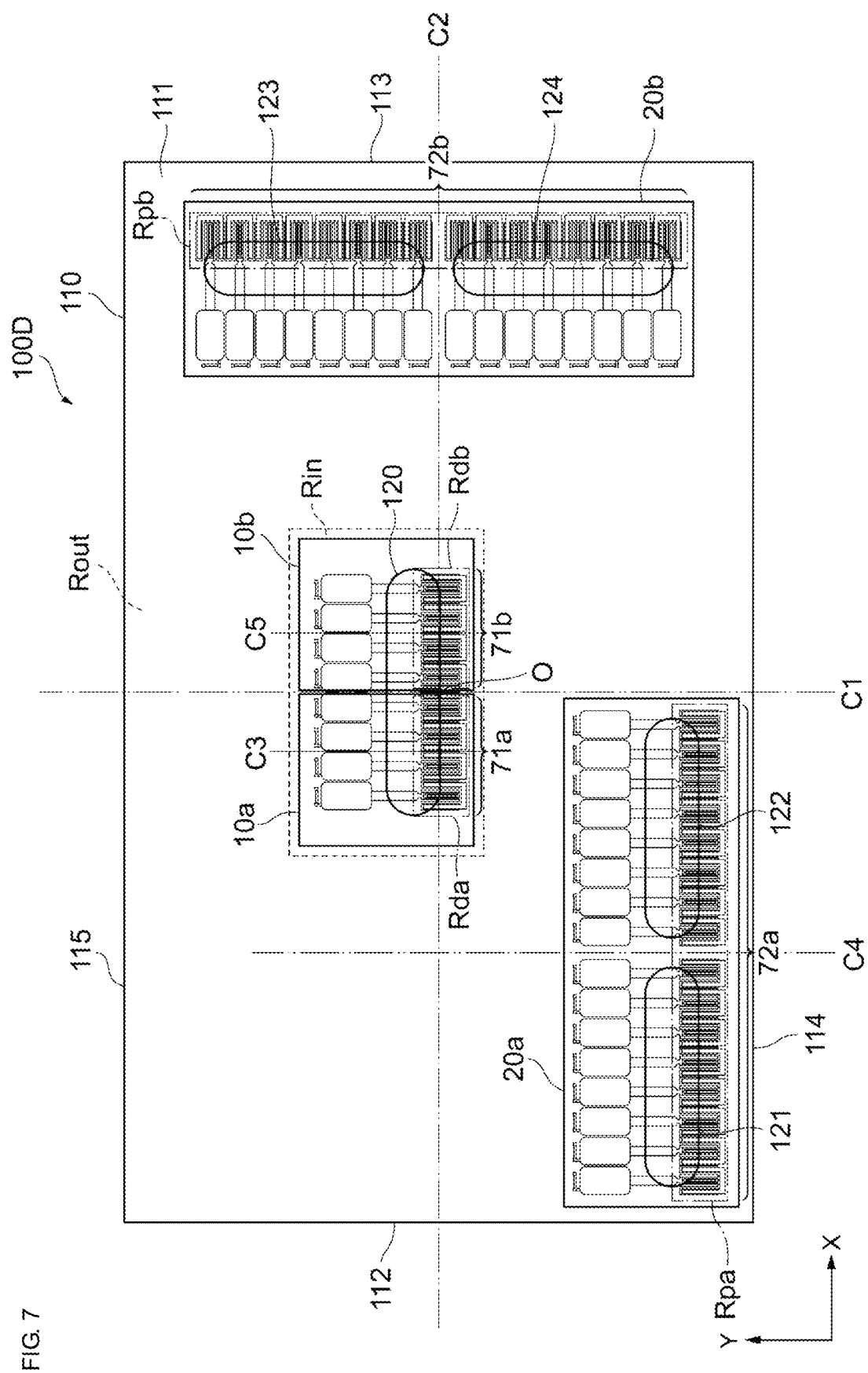
FIG. 7 is a plan view of a semiconductor device according to a fourth embodiment of the present disclosure.

FIG. 7 is a plan view of a semiconductor device 100D according to a fourth embodiment of the present disclosure. As illustrated in FIG. 7, the semiconductor device 100D is different from the semiconductor device 100A illustrated in FIG. 3 in the arrangement of the amplifier 20b in the second stage of the path 1B and in the arrangement of bumps.

In the present embodiment, the sixteen unit cells 72b included in the amplifier 20b in the second stage of the path 1B are aligned in one line in the Y-axis direction between the center line C1 of the semiconductor substrate 110 and the side 113 in the peripheral region Rout. The center line in the X-axis direction of the region Rpb in which the sixteen unit transistors are disposed overlaps the center line C2 of the semiconductor substrate 110. The unit cells 71b included in the amplifier 10b in the first stage of the path 1B are aligned near the center line C2. The bumps 123 and 124 are arranged on the unit cells 72b in accordance with the alignment of the unit cells 72b.

As in the foregoing structure, it is not always necessary for both the paths 1A and 1B to satisfy a condition that the center line of the region in which the unit transistors in the first stage are disposed is farther from the outer frame than the center line of the region in which the unit transistors in the second stage are disposed. It is sufficient that one of the paths 1A and 1B satisfy the condition. In addition, the amplifiers 10a and 20a of the path 1A and the amplifiers 10b and 20b of the path 1B need not necessarily be symmetrical about the center line C1, as illustrated in FIG. 7.

Figure 8:
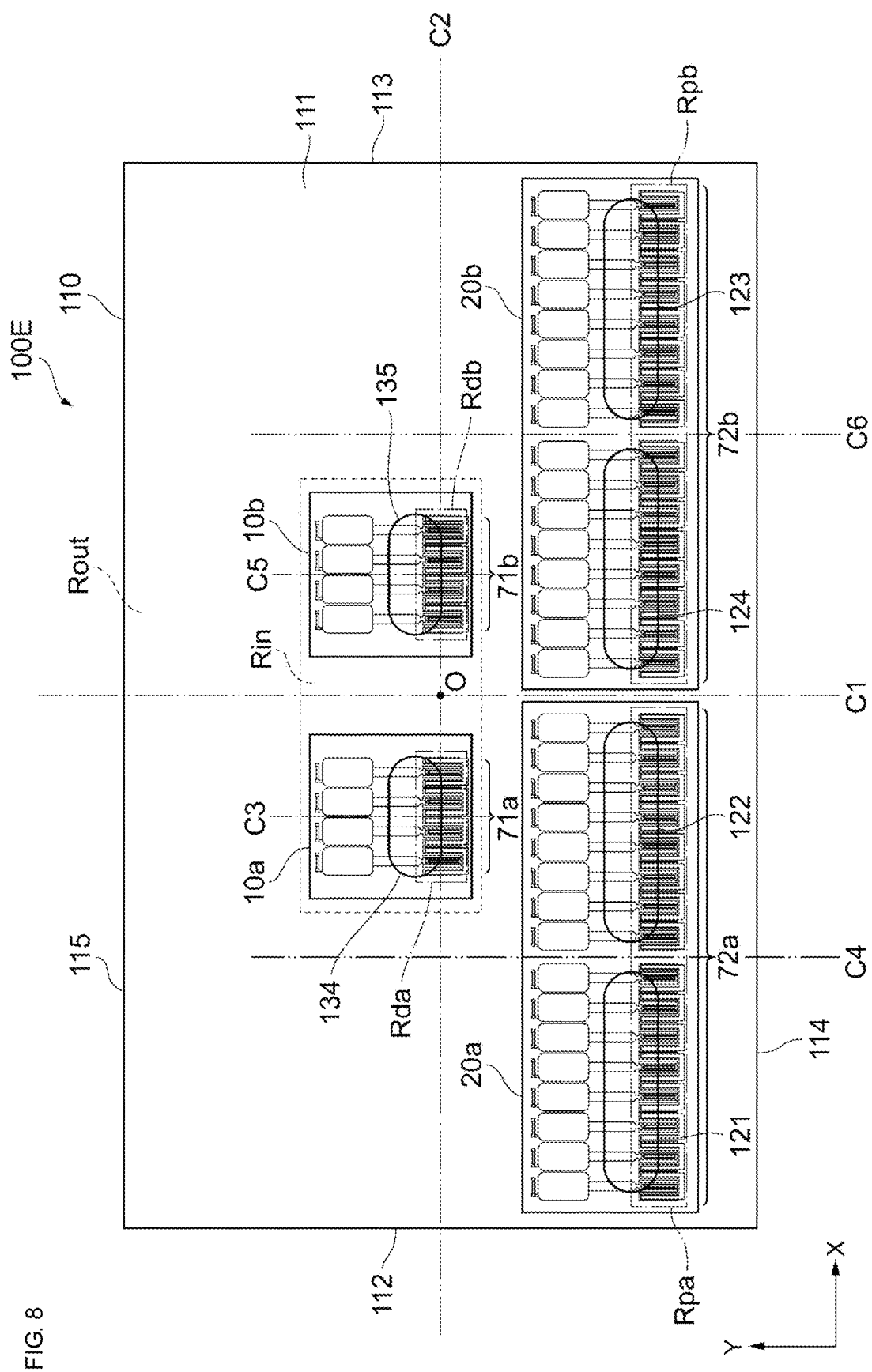
FIG. 8 is a plan view of a semiconductor device according to a fifth embodiment of the present disclosure.

FIG. 8 is a plan view of a semiconductor device 100E according to a fifth embodiment of the present disclosure. As illustrated in FIG. 8, the semiconductor device 100E is different from the semiconductor device 100A illustrated in FIG. 3 in the arrangement of the amplifiers 10a and 10b in the first stage of the paths 1A and 1B and in the shapes of bumps. Specifically, the semiconductor device 100E includes bumps 134 and 135 instead of the bump 120.

In the present embodiment, both the amplifier 10a in the first stage of the path 1A and the amplifier 10b in the first stage of the path 1B are disposed in the center region Rin of the semiconductor substrate 110, but the amplifiers 10a and 10b are not close to each other and are apart from each other. Accordingly, the bumps 134 and 135 are not shared between the two paths 1A and 1B, and are disposed on the unit cells 71a and the unit cells 71b, respectively.

As in the foregoing structure, the amplifier 10a in the first stage of the path 1A and the amplifier 10b in the first stage of the path 1B need not necessarily be close to each other, that is, there may be a space between the amplifiers 10a and 10b. In the semiconductor device 100E with this structure, the center line C3 of the region Rda in which the four unit transistors in the first stage are disposed is farther from the side 112 than the center line C4 of the region Rpa in which the sixteen unit transistors in the second stage are disposed. Also in the path 1B, the center line C5 of the region Rdb in which the four unit transistors in the first stage are disposed is farther from the side 113 than the center line C6 of the region Rpb in which the sixteen unit transistors in the second stage are disposed. Accordingly, advantages similar to those in the semiconductor device 100A can be obtained.

Figure 9:
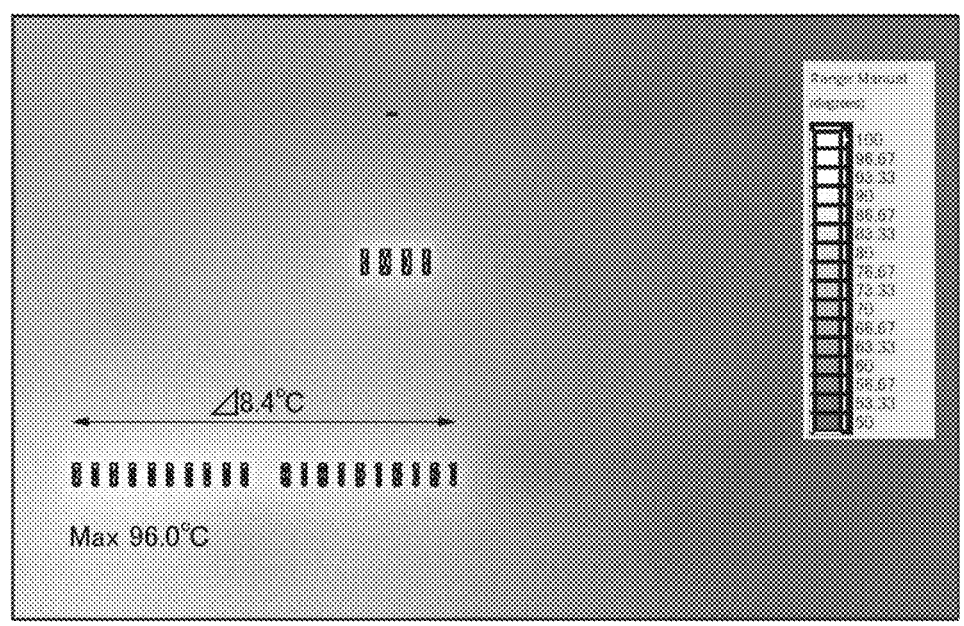
FIG. 9 illustrates a simulation result showing a temperature distribution in the semiconductor device according to the fifth embodiment of the present disclosure.

FIG. 9 illustrates a simulation result showing a temperature distribution in the semiconductor device 100E according to the fifth embodiment of the present disclosure.

Specifically, in the semiconductor device 100E, the maximum temperature of the plurality of unit transistors in the second stage is 96.0 degrees, and the difference between the maximum temperature and the minimum temperature is 8.4 degrees. Thus, the semiconductor device 100E is less effective than the semiconductor device 100A. However, when compared with the comparative example illustrated in FIG. 4A, the maximum temperature is decreased and variations in temperature are suppressed in the semiconductor device 100E.

Figure 10:
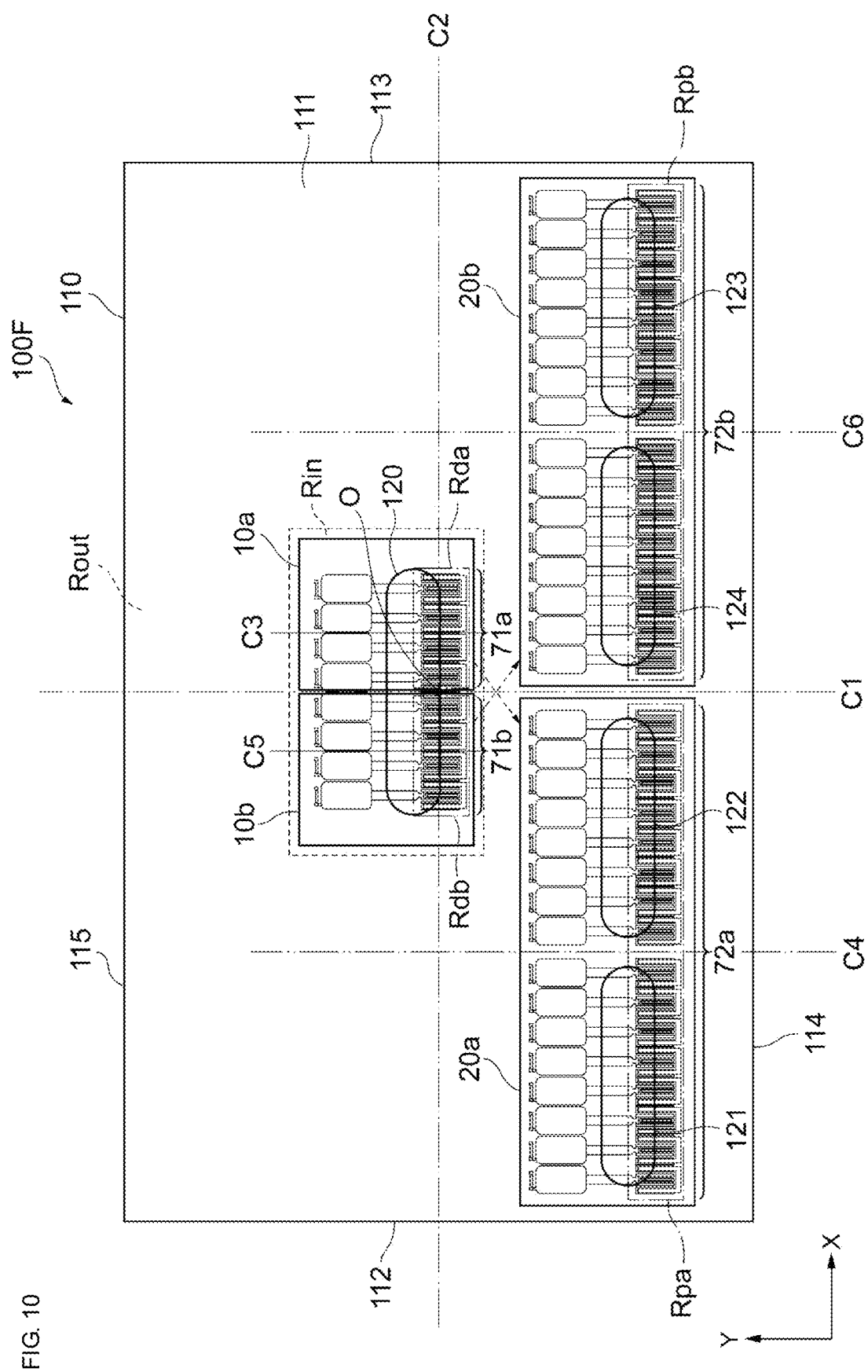
FIG. 10 is a plan view of a semiconductor device according to a sixth embodiment of the present disclosure.

FIG. 10 is a plan view of a semiconductor device 100F according to a sixth embodiment of the present disclosure. As illustrated in FIG. 10, the semiconductor device 100F is different from the semiconductor device 100A illustrated in FIG. 3 in that the positions of the amplifiers 10a and 10b in the first stage of the paths 1A and 1B are switched and that the arrangement of the bump is changed accordingly.

That is, in the present embodiment, the amplifier 10a in the first stage of the path 1A is arranged between the center line C1 of the semiconductor substrate 110 and the side 113, and the amplifier 10b in the first stage of the path 1B is arranged between the center line C1 of the semiconductor substrate 110 and the side 112. With this arrangement, the path 1A and the path 1B cross each other in any region on the semiconductor substrate 110. This arrangement is realized without causing mixture of a signal in the first frequency band and a signal in the second frequency band when the semiconductor substrate 110 includes a plurality of layers and the path 1A and the path 1B cross each other in different layers among the plurality of layers.

In the semiconductor device 100F with the above-described structure, the center line C3 of the region Rda in which the unit transistors in the first stage are disposed is farther from the center line C4 of the region Rpa in which the unit transistors in the second stage are disposed than in the semiconductor device 100A. Also in the path 1B, the center line C5 of the region Rdb in which the unit transistors in the first stage are disposed is farther from the center line C6 of the region Rpb in which the unit transistors in the second stage are disposed. Thus, in the semiconductor device 100F, the maximum temperature of the plurality of unit transistors can further be decreased and variations in temperature among the plurality of unit transistors can further be suppressed compared with the semiconductor device 100A.

Figure 11:
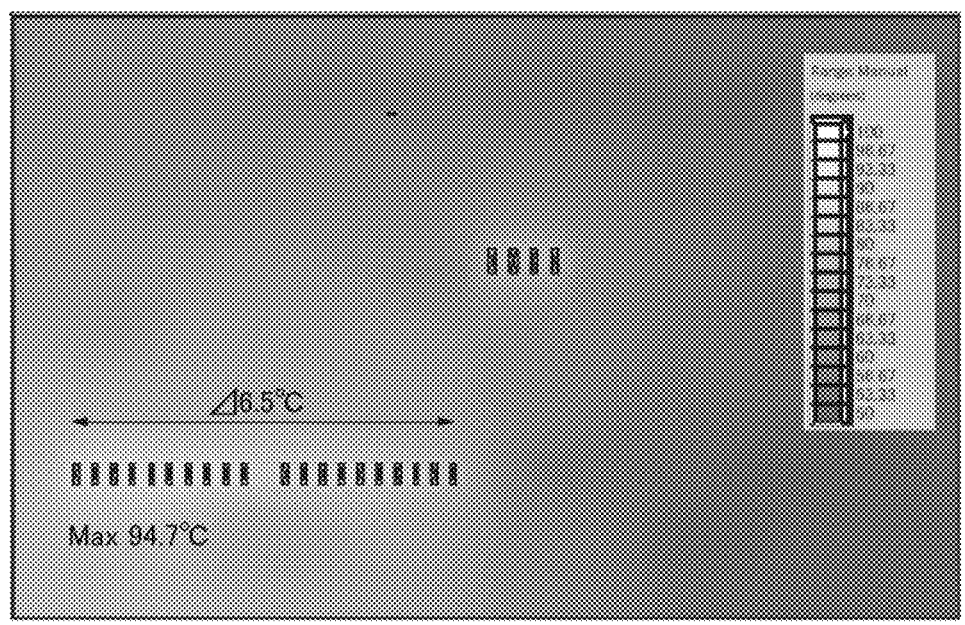
FIG. 11 illustrates a simulation result showing a temperature distribution in the semiconductor device according to the sixth embodiment of the present disclosure.

FIG. 11 illustrates a simulation result showing a temperature distribution in the semiconductor device 100F according to the sixth embodiment of the present disclosure.

Specifically, in the semiconductor device 100F, the maximum temperature of the plurality of unit transistors included in the amplifier 20a in the second stage is 94.7 degrees, and the difference between the maximum temperature and the minimum temperature is 6.5 degrees. That is, in the semiconductor device 100F, the maximum temperature is further decreased and variations in temperature are further suppressed, compared with the semiconductor device 100A.

Figure 12:
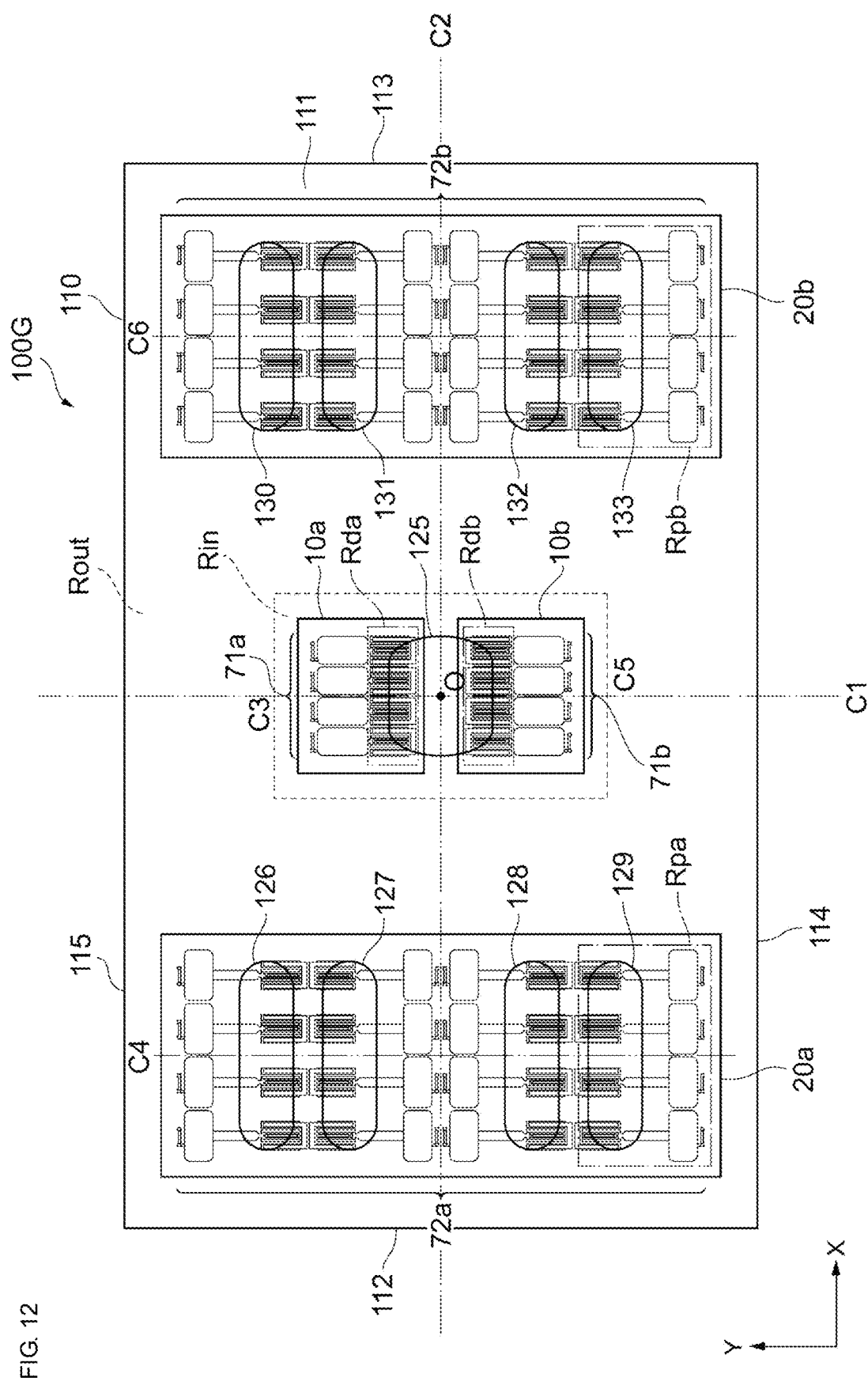
FIG. 12 is a plan view of a semiconductor device according to a seventh embodiment of the present disclosure.

FIG. 12 is a plan view of a semiconductor device 100G according to a seventh embodiment of the present disclosure. As illustrated in FIG. 12, in the semiconductor device 100G, the four unit cells 71a included in the amplifier 10a in the first stage of the path 1A are aligned in the X-axis direction across the center line C1 in the center region Rin of the semiconductor substrate 110. Likewise, the four unit cells 71b included in the amplifier 10b in the first stage of the path 1B are aligned in the X-axis direction across the center line C1 in the center region Rin of the semiconductor substrate 110. The unit cells 71a and the unit cells 71b are aligned so as to be symmetrical about the center line C2. The arrangement of the unit cells 71a, the unit cells 71b, and the bump 125 in the semiconductor device 100G is realized by clockwise rotating the unit cells 71a, the unit cells 71b, and the bump 125 in the semiconductor device 100B illustrated in FIG. 5 by 90 degrees on the XY plane.

The sixteen unit cells 72a included in the amplifier 20a in the second stage of the path 1A are aligned in the X-axis direction in units of four unit cells between the center line C1 and the side 112 in the peripheral region Rout. Likewise, the sixteen unit cells 72b included in the amplifier 20b in the second stage of the path 1B are aligned in the X-axis direction in units of four unit cells between the center line C1 and the side 113 in the peripheral region Rout. In the present embodiment, the center line C4 along the Y axis of the region Rpa is a boundary line that splits the four unit cells 72a into two groups each including two unit cells, and the center line C6 along the Y axis of the region Rpb is a boundary line that splits the four unit cells 72b into two groups each including two unit cells. The arrangement of the unit cells 72a and the bumps 126 to 129 and the arrangement of the unit cells 72b and the bumps 130 to 133 in the semiconductor device 100G are respectively realized by clockwise rotating the unit cells 72a and the bumps 126 to 129 in the semiconductor device 100C illustrated in FIG. 6 by 90 degrees on the XY plane and by counterclockwise rotating the unit cells 72b and the bumps 130 to 133 in the semiconductor device 100C illustrated in FIG. 6 by 90 degrees on the XY plane.

In the semiconductor device 100G with this structure, the center line C3 of the region Rda in which the four unit transistors in the first stage are disposed is farther from the side 112 than the center line C4 of the region Rpa in which the sixteen unit transistors in the second stage are disposed. Also in the path 1B, the center line C5 of the region Rdb in which the four unit transistors in the first stage are disposed is farther from the side 113 than the center line C6 of the region Rpb in which the sixteen unit transistors in the second stage are disposed. Accordingly, advantages similar to those in the semiconductor device 100A can be obtained.

Figure 13:
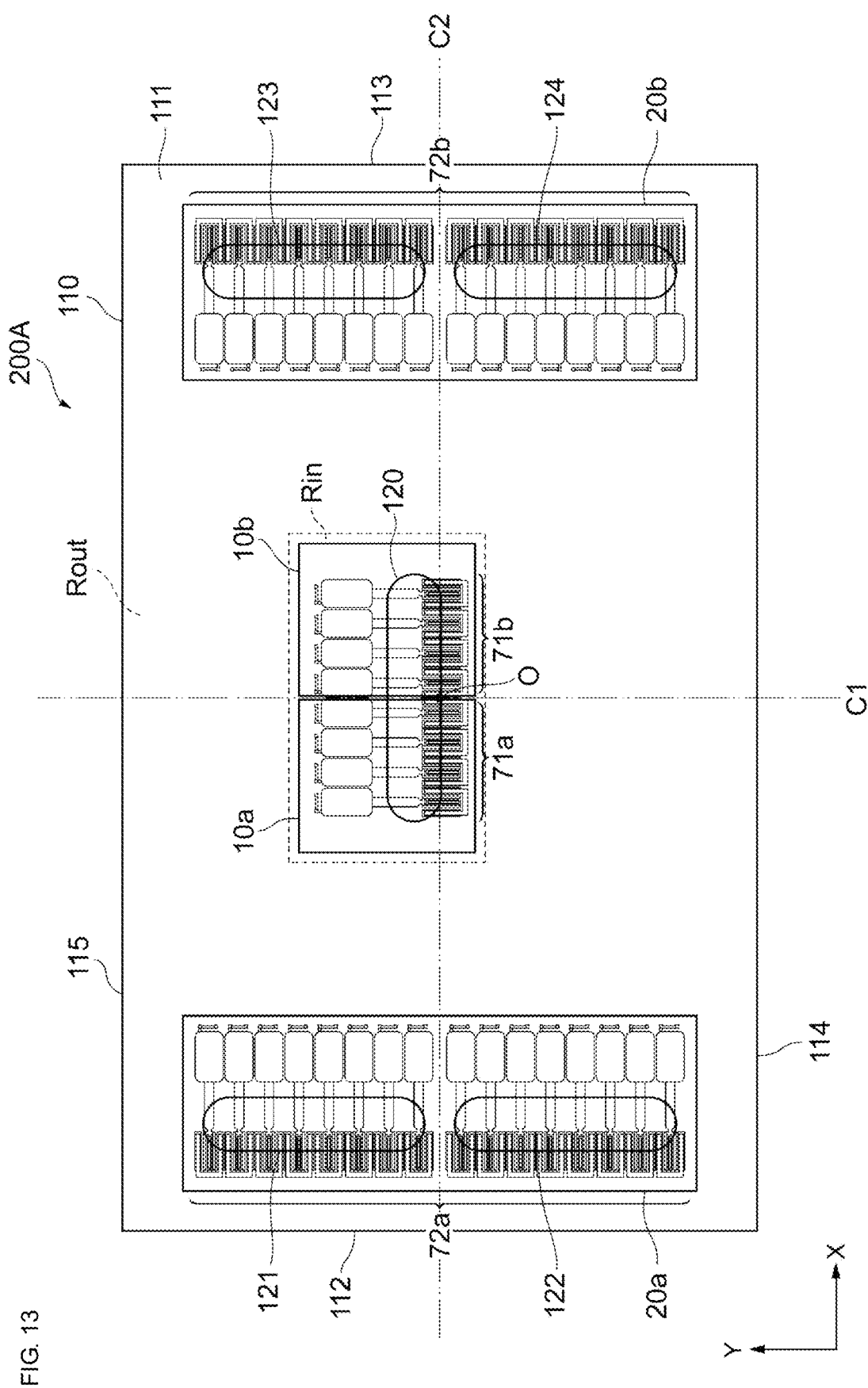
FIG. 13 is a plan view of a semiconductor device according to a reference example.

FIG. 13 is a plan view of a semiconductor device 200A according to a reference example. For convenience of description, the elements corresponding to the elements described in the foregoing embodiments are denoted by similar reference numerals or symbols and the description thereof is omitted. As illustrated in FIG. 13, in the semiconductor device 200A, the amplifier 20a in the second stage of the path 1A as well as the amplifier 20b in the second stage of the path 1B are arranged in the Y-axis direction, compared with the semiconductor device 100D illustrated in FIG. 7.

Specifically, the sixteen unit cells 72a included in the amplifier 20a are aligned in one line in the Y-axis direction between the center line C1 and the side 112 in the peripheral region Rout. Accordingly, the bumps 121 and 122 are arranged on the unit cells 72a.

In the reference example, the bump 120 disposed on the unit cells 71a and 71b included in the amplifiers 10a and 10b in the first stage is shared between the two paths 1A and 1B, and thus the area of the bump can be increased compared with a structure in which a bump is provided for each path. Furthermore, the area of the ground electrode of the module substrate connected to the bump 120 can also be increased. Thus, compared with a structure in which a bump is provided for each path, the resistance components and inductance components of the emitters are reduced and a decrease in gain of the amplifiers 10a and 10b can be suppressed.

Exemplary embodiments of the present disclosure have been described above. Each of the semiconductor devices 100A to 100G includes the semiconductor substrate 110 including the principal surface 111 that is parallel to the XY plane; a plurality of first unit transistors each of which amplifies the input signal RF1a in the first frequency band to output the amplified signal RF2a; and a plurality of second unit transistors each of which amplifies the amplified signal RF2a to output the amplified signal RF3a. The principal surface 111 includes the side 112 that is parallel to the Y-axis direction. On the semiconductor substrate 110, the plurality of second unit transistors are aligned in the X-axis direction between the side 112 and the center line C1 in the Y-axis direction of the semiconductor substrate 110 in plan view of the principal surface 111, and the plurality of first unit transistors are aligned such that the first center line C3 in the Y-axis direction of the region Rda in which the plurality of first unit transistors are aligned is farther from the side 112 than the second center line C4 in the Y-axis direction of the region Rpa in which the plurality of second unit transistors are aligned. Accordingly, an increase in temperature of a unit transistor near the side 112 can be suppressed. Thus, the maximum temperature of the unit transistors can be decreased, and variations in temperature among the unit transistors can be suppressed.

Each of the semiconductor devices 100A to 100C and 100E to 100G includes a plurality of third unit transistors each of which amplifies the input signal RF1b in the second frequency band to output the amplified signal RF2b; and a plurality of fourth unit transistors each of which amplifies the amplified signal RF2b to output the amplified signal RF3b. The principal surface 111 includes the side 113 opposed to the side 112. On the semiconductor substrate 110, the plurality of fourth unit transistors are aligned in the X-axis direction between the side 113 and the center line C1 in plan view of the principal surface 111. The plurality of third unit transistors are aligned such that the third center line C5 in the Y-axis direction of the region Rdb in which the plurality of third unit transistors are aligned is farther from the side 113 than the fourth center line C6 in the Y-axis direction of the region Rpb in which the plurality of fourth unit transistors are aligned. Accordingly, an increase in temperature of the unit transistors can be suppressed in the plurality of paths 1A and 1B.

In the semiconductor device 100F, the plurality of first unit transistors are aligned between the center line C1 and the side 113, and the plurality of third unit transistors are aligned between the center line C1 and the side 112. Accordingly, the center line C3 of the region Rda in which the unit transistors in the first stage are disposed is farther from the center line C4 of the region Rpa in which the unit transistors in the second stage are disposed than in the semiconductor device 100A. Thus, in the semiconductor device 100F, the maximum temperature of the plurality of unit transistors can further be decreased and variations in temperature among the plurality of unit transistors can further be suppressed, compared with the semiconductor device 100A.

In each of the semiconductor devices 100A to 100D, 100F, and 100G, the plurality of first unit transistors and the plurality of third unit transistors are aligned adjacent to each other in plan view of the principal surface 111. Each semiconductor device includes a bump that is electrically connected to emitters or sources of the plurality of first unit transistors and emitters or sources of the plurality of third unit transistors. Accordingly, the area of the bump can be increased compared with a structure in which a bump is provided for each path. Thus, the resistance components and inductance components of the emitters are decreased, and a decrease in gain of the amplifier can be suppressed.

The above-described embodiments are for facilitating understanding of the present disclosure and are not intended to limit the present disclosure. The present disclosure can be changed or improved without deviating from the gist thereof, and includes the equivalents thereof. In other words, each embodiment appropriately changed in design by those skilled in the art is included in the scope of the present disclosure as long as the changed embodiment has features of the present disclosure. For example, the elements of each embodiment and the arrangement, materials, conditions, shapes, sizes, and the like of the elements are not limited to those exemplified and can be appropriately changed. In addition, the elements of each embodiment can be combined as long as it is technically possible, and the combination thereof is included in the scope of the present disclosure as long as it has features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
a semiconductor substrate including a principal surface that is parallel to a plane defined by a first direction and a second direction substantially orthogonal to the first direction, the principal surface including a first side that is parallel to the first direction;
first unit transistors, each of which is configured to amplify a first signal in a first frequency band to output a second signal; and
second unit transistors, each of which is configured to amplify the second signal to output a third signal,
wherein, on the semiconductor substrate,
the second unit transistors are aligned in the second direction between the first side and a substrate center line in the first direction of the semiconductor substrate in plan view of the principal surface, and
the first unit transistors are aligned such that a first center line in the first direction of a region in which the first unit transistors are aligned is farther from the first side than a second center line in the first direction of a region in which the second unit transistors are aligned.

2. The semiconductor device according to claim 1, wherein, on the semiconductor substrate,
the first unit transistors are aligned in a center region including a center of the principal surface in plan view of the principal surface, and
the second unit transistors are aligned in a peripheral region surrounding the center region of the principal surface.

3. The semiconductor device according to claim 1, further comprising:
third unit transistors, each of which is configured to amplify a fourth signal in a second frequency band to output a fifth signal; and
fourth unit transistors, each of which is configured to amplify the fifth signal to output a sixth signal,
wherein
the principal surface includes a second side opposed to the first side, and
on the semiconductor substrate,
the fourth unit transistors are aligned in the second direction between the second side and the substrate center line in plan view of the principal surface, and
the third unit transistors are aligned such that a third center line in the first direction of a region in which the third unit transistors are aligned is farther from the second side than a fourth center line in the first direction of a region in which the fourth unit transistors are aligned.

4. The semiconductor device according to claim 3, wherein
the first unit transistors are aligned between the substrate center line and the second side, and
the third unit transistors are aligned between the substrate center line and the first side.

5. The semiconductor device according to claim 3, wherein
the first unit transistors and the third unit transistors are aligned adjacent to each other in plan view of the principal surface,
the semiconductor device further comprising a bump that is electrically connected to emitters or sources of the first unit transistors and emitters or sources of the third unit transistors.

6. The semiconductor device according to claim 2, further comprising:
third unit transistors, each of which is configured to amplify a fourth signal in a second frequency band to output a fifth signal; and
fourth unit transistors, each of which is configured to amplify the fifth signal to output a sixth signal,
wherein
the principal surface includes a second side opposed to the first side, and
on the semiconductor substrate,
the fourth unit transistors are aligned in the second direction between the second side and the substrate center line in plan view of the principal surface, and
the third unit transistors are aligned such that a third center line in the first direction of a region in which the third unit transistors are aligned is farther from the second side than a fourth center line in the first direction of a region in which the fourth unit transistors are aligned.

7. The semiconductor device according to claim 6, wherein
the first unit transistors are aligned between the substrate center line and the second side, and
the third unit transistors are aligned between the substrate center line and the first side.

8. The semiconductor device according to claim 6, wherein
the first unit transistors and the third unit transistors are aligned adjacent to each other in plan view of the principal surface,
the semiconductor device further comprising a bump that is electrically connected to emitters or sources of the first unit transistors and emitters or sources of the third unit transistors.

9. The semiconductor device according to claim 7, wherein
the first unit transistors and the third unit transistors are aligned adjacent to each other in plan view of the principal surface,
the semiconductor device further comprising a bump that is electrically connected to emitters or sources of the first unit transistors and emitters or sources of the third unit transistors.

10. The semiconductor device according to claim 4, wherein
the first unit transistors and the third unit transistors are aligned adjacent to each other in plan view of the principal surface,
the semiconductor device further comprising a bump that is electrically connected to emitters or sources of the first unit transistors and emitters or sources of the third unit transistors.

* * * * *